United States Patent
Zhang et al.

(10) Patent No.: US 8,962,410 B2
(45) Date of Patent: Feb. 24, 2015

(54) TRANSISTORS WITH DIFFERENT THRESHOLD VOLTAGES

(75) Inventors: Da Zhang, Austin, TX (US); Konstantin V. Loiko, Austin, TX (US); Spencer E. Williams, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 270 days.

(21) Appl. No.: 13/282,210

(22) Filed: Oct. 26, 2011

(65) Prior Publication Data
US 2013/0109141 A1    May 2, 2013

(51) Int. Cl.
*H01L 21/337* (2006.01)
*H01L 21/8234* (2006.01)
*H01L 21/8238* (2006.01)

(52) U.S. Cl.
CPC *H01L 21/823493* (2013.01); *H01L 21/823412* (2013.01); *H01L 21/823807* (2013.01); *H01L 21/823892* (2013.01)

USPC ..... 438/194; 438/174; 438/217; 257/E21.632

(58) Field of Classification Search
CPC .............. H01L 21/823807; H01L 21/823814; H01L 29/7837; H01L 29/6695
USPC ......... 438/174, 194, 199, 217, 275–276, 289; 257/E21.433, E21.632
See application file for complete search history.

(56) References Cited

U.S. PATENT DOCUMENTS

| | | |
|---|---|---|
| 2003/0025165 A1* | 2/2003 | Kim et al. ............... 257/369 |
| 2005/0170588 A1* | 8/2005 | Lee et al. ............... 438/275 |
| 2011/0175173 A1* | 7/2011 | Takebuchi et al. ..... 257/371 |
| 2011/0180883 A1 | 7/2011 | Chen et al. |

* cited by examiner

*Primary Examiner* — Thanhha Pham
(74) *Attorney, Agent, or Firm* — David G. Dolezal

(57) ABSTRACT

A first transistor and a second transistor are formed with different threshold voltages. A first gate is formed over the first region of a substrate for a first transistor and a second gate over the second region for a second transistor. The first region is masked. A threshold voltage of the second transistor is adjusted by implanting through the second gate while masking the first region. Current electrode regions are formed on opposing sides of the first gate and current electrode regions on opposing sides of the second gate.

17 Claims, 5 Drawing Sheets

TRANSISTORS WITH DIFFERENT THRESHOLD VOLTAGES

BACKGROUND OF THE INVENTION

1. Field of the Invention

This invention relates to transistors and more specifically to transistors with different threshold voltages.

2. Description of the Related Art

Some integrated circuits include transistors with different threshold voltages. In one example, an integrated circuit includes different regions with the transistors of one region having a threshold voltage that is different from the threshold voltages of transistors of another region. In one example, the wells of the different transistor regions have different impurity dopant concentrations to provide the transistors with different threshold voltages. Separate well masks and separate ion implanting operations are used for each region to provide wells of different doping concentrations.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

It has been discovered that using selective through-gate ion implanting to selectively implant dopants into the channel regions of transistors in one integrated circuit region may allow for transistors of that region to have a different threshold voltage from transistors of another region, where both regions have a common well doping of the channel region.

FIGS. 1-8 set forth partial cross sectional side views of various stages of a wafer in the manufacture of an integrated circuit having two different regions of transistors with different threshold voltages.

Figure 1:
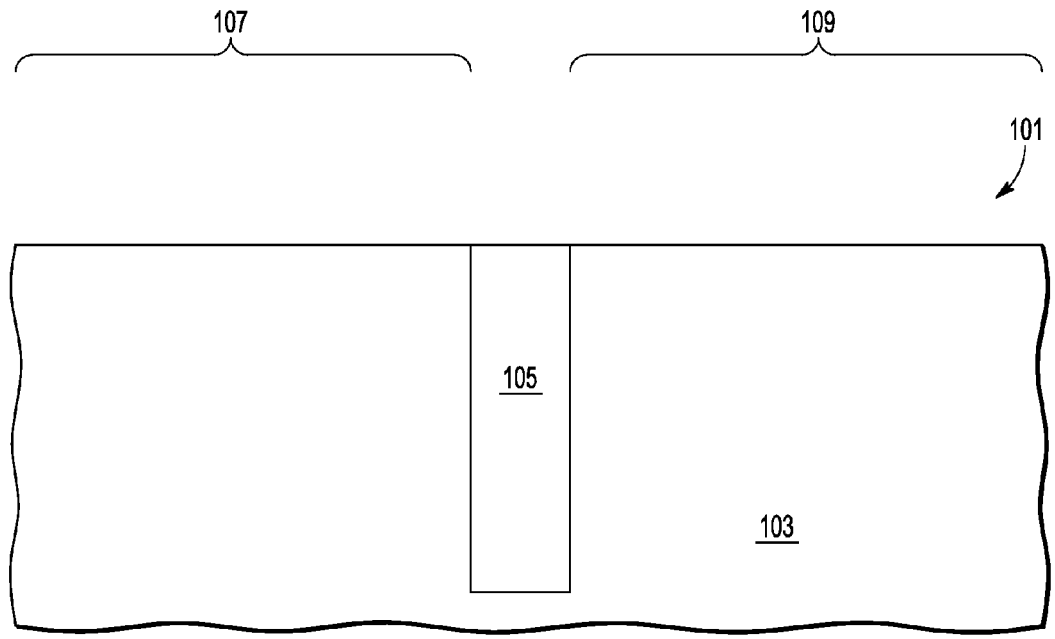
FIGS. 1-8 set forth partial cutaway side views of a wafer a various stages in the manufacture of an integrated circuit according to one embodiment of the present invention.

As shown in FIG. 1, wafer 101 includes a semiconductor substrate 103 on which multiple transistors will be formed. In one embodiment, substrate 103 is made of single crystal silicon, but in other embodiments, may be made of other semiconductor materials e.g. silicon germanium, silicon carbon, or a III-V semiconductor material. In some embodiments, substrate 103 is doped with conductivity impurities. In the embodiment shown, substrate 103 has a bulk semiconductor substrate configuration, but may have other configurations in other embodiments (e.g. a semiconductor on insulator configuration). With a semiconductor on insulator configuration, a semiconductor layer is located on a buried dielectric layer.

An isolation structure 105 is located in substrate 103 to form separate device regions 107 and 109. In one embodiment, structure 105 is characterized as a shallow trench isolation structure formed of silicon dioxide, but may be made of other materials and/or formed by other processes in other embodiments. Also in other embodiments, structure 105 may be formed at other times (e.g. after the stage of FIG. 2 or the stage of FIG. 3) during the fabrication of an integrated circuit. In some embodiments, regions 107 and 109 may be separated by other active regions and isolation structures in addition to structure 105. In subsequent operations, transistors having one threshold voltage will be formed in region 107 and transistors having a different threshold voltage will be formed in region 109.

Figure 2:
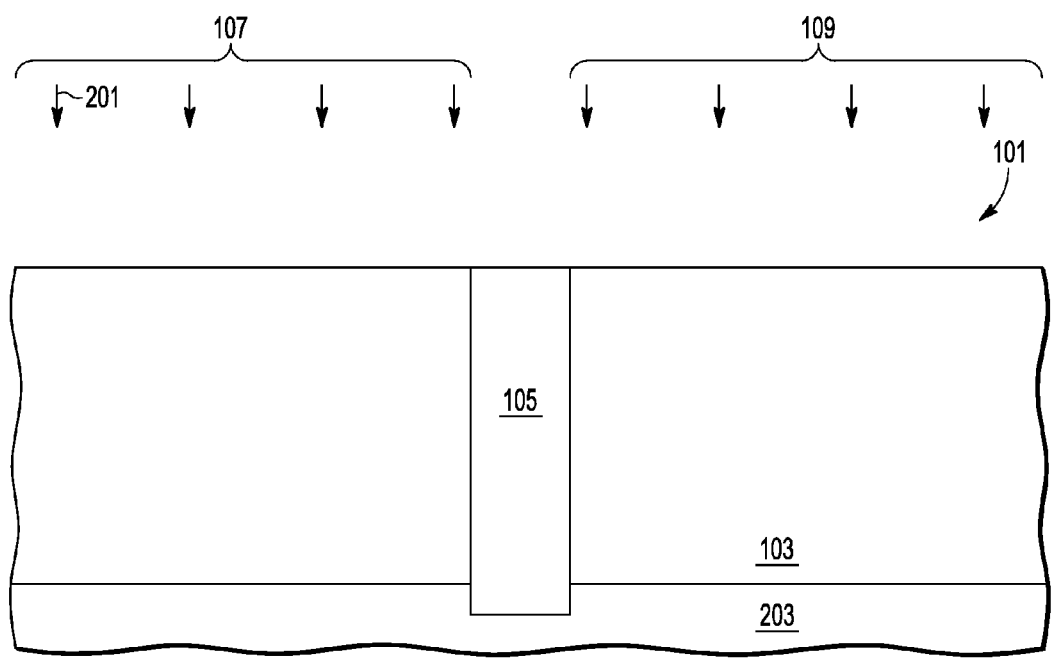

FIG. 2 shows wafer 101 during the implanting of conductivity impurity ions to form a deep well region 203 which extends across regions 107 and 109. In an embodiment where N-channel devices are to be formed in regions 107 and 109, ions 201 are P-type impurity dopants (e.g. boron, indium). In one embodiment where N-channel devices are being formed, boron ions 201 are implanted at an energy in the range of 250-350 keV and at a dosage in the range of $1\text{-}2\times10^{13}$ atoms/$cm^2$ to form region 203. However, ions 201 may be implanted at other energies and/or at other concentrations in other embodiments.

Figure 3:
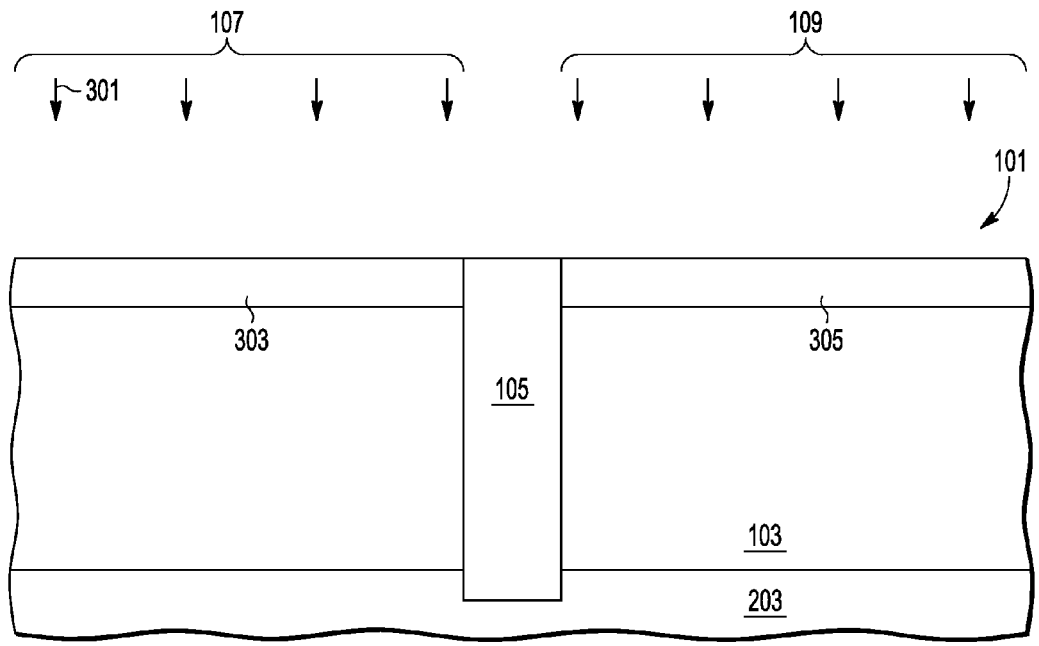

FIG. 3 shows wafer 101 during the implanting of ions 301 to form shallow well regions 303 and 305 in device regions 107 and 109 respectively. Regions 303 and 305 are formed simultaneously from the same ion implant operation. In one embodiment where N-channel devices are being formed, boron, ions 301 are implanted at an energy in the range of 15-30 keV and at a dosage in the range of $1\text{-}5\times10^{12}$ atoms/$cm^2$. However, ions 301 may be implanted at other energies and/or at other dosages in other embodiments. The transistors to be formed in regions 107 have their channel regions in well region 303 and the transistors to be formed in region 109 having their channel regions in well region 305. In one embodiment, the implant dosage and energy are of values to set the threshold voltages of the transistors formed in region 109 at their desired value but are not at values to set the threshold voltages of the transistors in regions 107 at their desired value.

Figure 4:
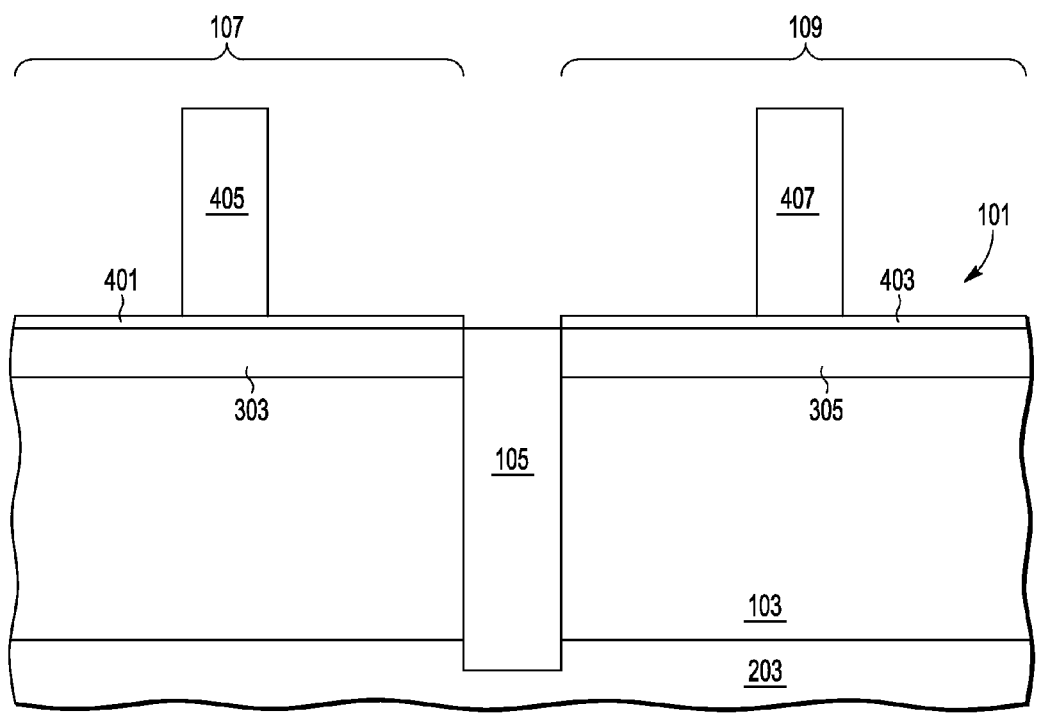

FIG. 4 shows wafer 101 after gate dielectrics and gate structures have been formed on wafer 101. In the embodiment shown, gate dielectric 401 is formed in region 107 and gate dielectric 403 is formed in region 109. In one embodiment, gate dielectric 401 has a different thickness than dielectric 403. In another embodiment, dielectrics 401 and 403 are made of different materials (e.g. one is a high K dielectric, the other is silicon oxide). In one embodiment, dielectric 401 is 50 angstroms thick and is made of silicon dioxide and dielectric 403 is 20 angstroms thick and is made of silicon dioxide. In other embodiments, dielectrics 401 and 403 are of the same thickness and material. In one embodiment, the thickness of dielectric 401 is thicker so that the transistors of region 107 can operate at higher voltages than the transistors of region 109. In one embodiment, the transistors of region 107 are used to implement I/O circuitry and are designed for an operating voltage of 2.5 volts, and the transistors of region 109 are used to implement circuitry of a processor core and are designed for an operating voltage of 1.0 volts. However, the transistors of regions 107 and 109 may be used to implement different circuitry and/or operate at different operating voltages in different embodiments.

After the formation of dielectrics 401 and 403, transistor gates 405 and 407 are formed in regions 107 and 109, respectively. FIG. 4 shows gate 405 formed in region 107 and gate 407 formed in region 109. In one embodiment, the gates are formed by forming a layer of polysilicon over wafer 101 and patterning the layer to leave the gate structures. In one embodiment, gates 405 and 407 have a thickness of 1000 A, but may have other thicknesses in other embodiments. In one embodiment, the lengths of the gates of region 107 are the same as the lengths of the gates of region 109. However, the gates of the different regions (and within the same region) may be of different lengths. In other embodiments, the gates may be made of other conductive materials and/or may be made of multiple layers of different materials. In some embodiments, the gates of region 107 (e.g. gate 405) are made of a different material than the gates of region 109 (e.g. gate 407).

After the stage shown in FIG. 4, wafer 101 is subjected to a further etch to remove the portions of dielectrics 401 and 403 located outside of gates 405 and 407. However, in some embodiments, those portions are not removed at this time.

Figure 5:
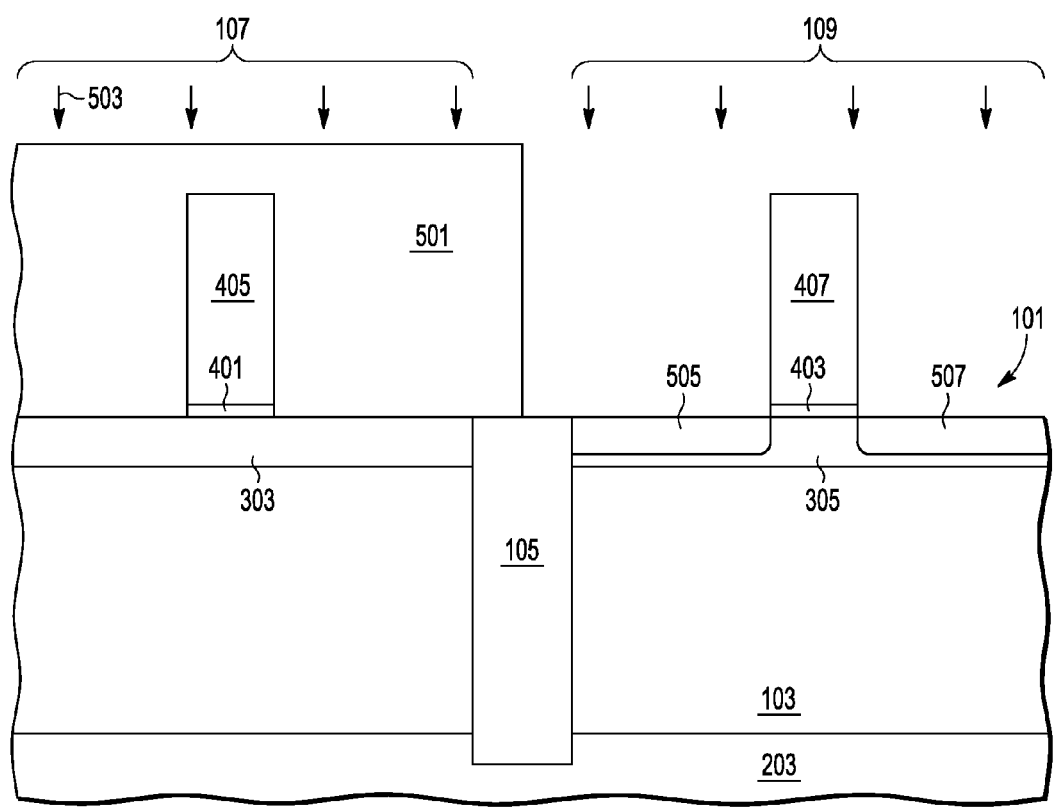

FIG. 5 shows a view of wafer 101 during the implanting of ions 503 to form source/drain extension regions (e.g. regions 505 and 507) in region 109. In an embodiment where an N-channel transistor is being formed, ions 503 are N type conductivity dopants (e.g. arsenic, phosphorous). Prior to implanting, a mask 501 is formed over region 107 to prevent ions 503 from being implanted in region 107. In one embodiment, mask 501 is made of a patterned photo resist material, but may be made of other materials in other embodiments. A source region and a drain region are current electrode regions of a MOSFET.

In one embodiment, phosphorus ions 503 are implanted into regions 505 and 507 at an energy in the range of 1-50 keV and at a dosage in the range of $1e^{13}$-$2\ e^{15}$, but may be implanted at other energies and/or at other dosages in other embodiments. In the embodiment shown, the bottoms of extension regions 507 and 505 are not as deep as the bottom of the shallow well region 305. Source/drain extensions are portions of source/drain regions located closest to the channel region whose depth is reduced with respect to the subsequently formed deeper portions of the source/drain regions to reduce channel leakage. In some embodiments, the extension regions may be more lightly doped than the deeper portions of the source/drain regions. Although not shown, a tilted halo implant may optionally be implemented after the mask 501 formation. Halo implant applies a dopant type opposite to the extension dopant type. For example, for a NFET with N-type extension, the halo dopant is P-type.

Figure 6:
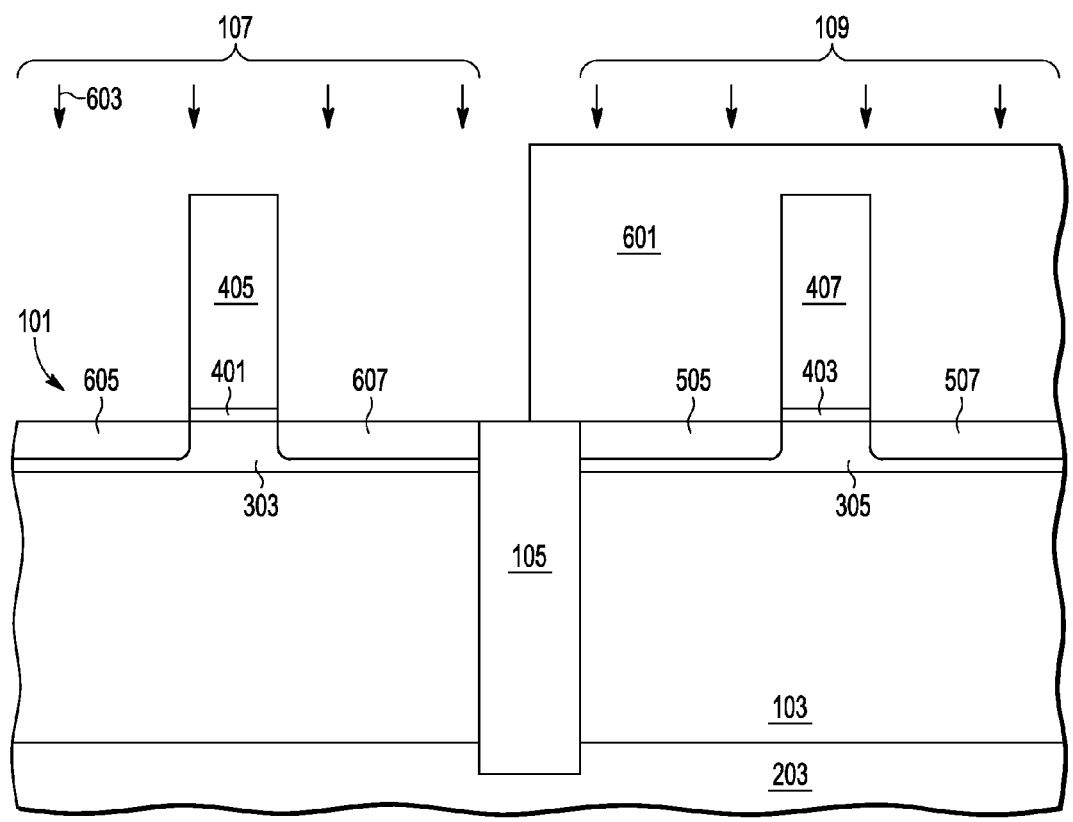

FIG. 6 shows wafer 101 during the implanting of ions 603 into the source/drain extension regions (e.g. extension regions 605 and 607) in region 107. In an embodiment where an N-channel transistor is being formed, ions 603 are N-type conductivity dopants (e.g. arsenic, phosphorous). Prior to implanting, mask 501 is removed and mask 601 is formed over region 109 to prevent ions 603 from being implanted in region 109. In one embodiment, mask 601 is made of a patterned photo resist material, but may be made of other materials in other embodiments.

In one embodiment, phosphorus ions 603 are implanted into regions 605 and 607 at an energy in the range of 1-50 keV and at a dosage in the range of $1e^{13}$-$2\ e^{15}$ atoms/cm$^2$, but may be implanted at other energies and at other dosages in other embodiments. In the embodiment shown, the bottoms of extension regions 605 and 607 are not as deep as the bottom of the shallow well region 305. In one embodiment, the dosage and energy of the dopants that form the extensions of region 107 are different from the dosage and/or energy of the dopants that form the extensions of region 109. Although not shown, a tilted halo implant may optionally be implemented after the mask 601 formation. Halo implant applies a dopant type opposite to the extension dopant type. For example, for a NFET with N-type extension, the halo dopant is P-type.

Figure 7:
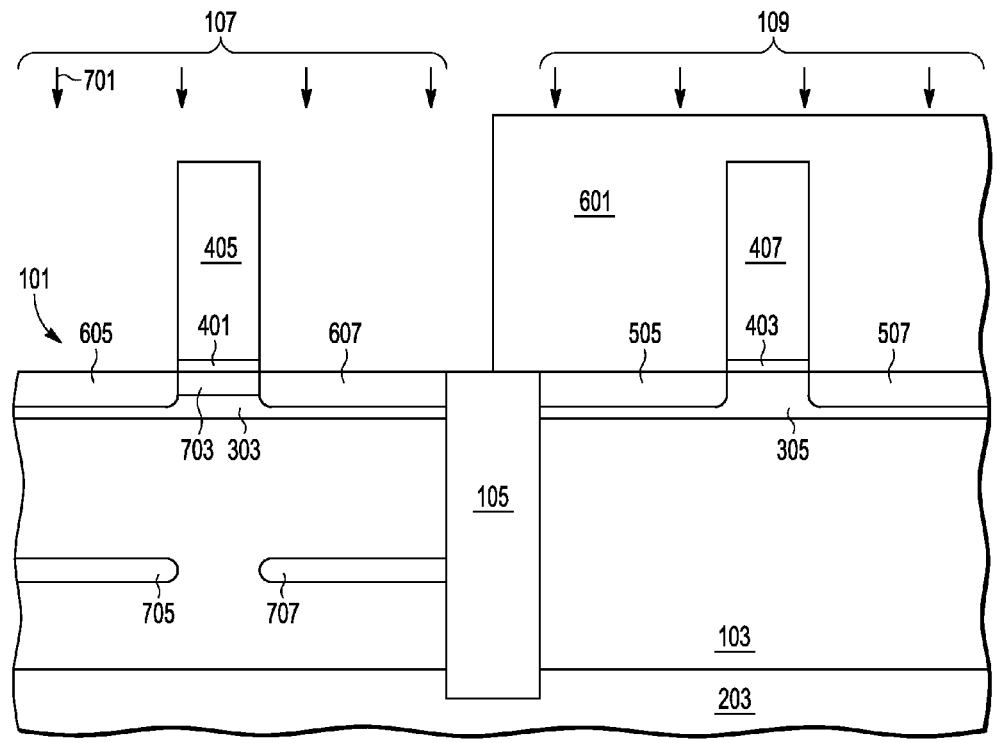

FIG. 7 shows wafer 101 during the implanting of ions 701 through the gates of the transistors of regions 107 to adjust the threshold voltage of those transistors. This implanting operation re-uses the extension mask 601. In the embodiment shown, ions 701 are implanted through gate 405 and into region 703. In one embodiment where an N-channel device is being formed, ions 701 are P-type ions. For example, in one embodiment for an N-channel device, boron ions 701 are implanted at an energy in the range of 30-100 keV and at a dosage in the range of $1e^{12}$-$1e^{13}$ atoms/cm$^2$. However ions 701 may be implanted at other energies and/or other dosages in other embodiments.

In the embodiment shown, ions 701 are implanted at an angle that is generally 90 degrees with respect to the surface of substrate 103. However, in other embodiments, ions 701 may be implanted through gate 405 at an angle other than 90 degrees.

In the embodiment shown, region 703 is located near the surface of substrate 103 and is in the channel region of the transistor of gate 405. The P type dopants of region 703 act to increase the threshold voltage of the transistor of region 107 with respect to the N-type transistors of region 109 (whose channel regions are not implanted with ions 701 due to being blocked by mask 601). In one embodiment, ions 701 raise the threshold voltage of the transistors of region 107 by an amount in a range of 0.1-0.6 volts, but may raise it by others voltages in other embodiments.

In another embodiment where an N-channel transistor is being formed, N-type impurities may be implanted into region 703 to reduce the threshold voltages of the transistors of region 107 with respect to the threshold voltages of the transistors of regions 109.

In the embodiment shown, ions that are implanted outside of gate 405 are implanted in regions 705 and 707. At these locations, ions 701 are implanted at a greater depth than the ions of region 703 in that they do not have to penetrate gate 405. Because these regions are located deeper in substrate 103, the impact to the operation of subsequently formed transistors is negligible in the embodiment shown.

Using a through-gate ion implanting process to set the threshold voltage of the transistors of region 107 while the other regions of the wafer are masked with the extensions mask (e.g. mask 601) allows for the implementation of transistors with different threshold voltages in an integrated circuit without having to selectively implant the well regions (e.g. regions 303 and 305) of the different active wafer regions (e.g. regions 107 and 109). Thus, the well regions of the different active wafer regions can be formed with the same well region implant (e.g. the implanting of ions 301 in FIG. 3). In contrast, prior art methods require separate masks at the stage of FIG. 3 to selectively implant different ion concentrations into the well regions 305 and 305 so as to selectively set the threshold voltages for the transistors of those regions. Accordingly, with the through gate implanting process described herein, at least one mask step may be saved over the prior art method.

In some embodiments, well region 703 may be implanted prior to implanting extension regions 605 and 607. Also in other embodiments, the extensions and threshold implants may be performed in region 107 prior to performing the extension implants of region 109.

In some embodiments, a through gate threshold adjustment implant (e.g. similar to that shown in FIG. 7) may also be performed for the transistors of region 109 when region 107 is masked with the extension mask (e.g. mask 501). Such an implant may be performed where there are more than two regions of transistors of different threshold voltages.

Figure 8:
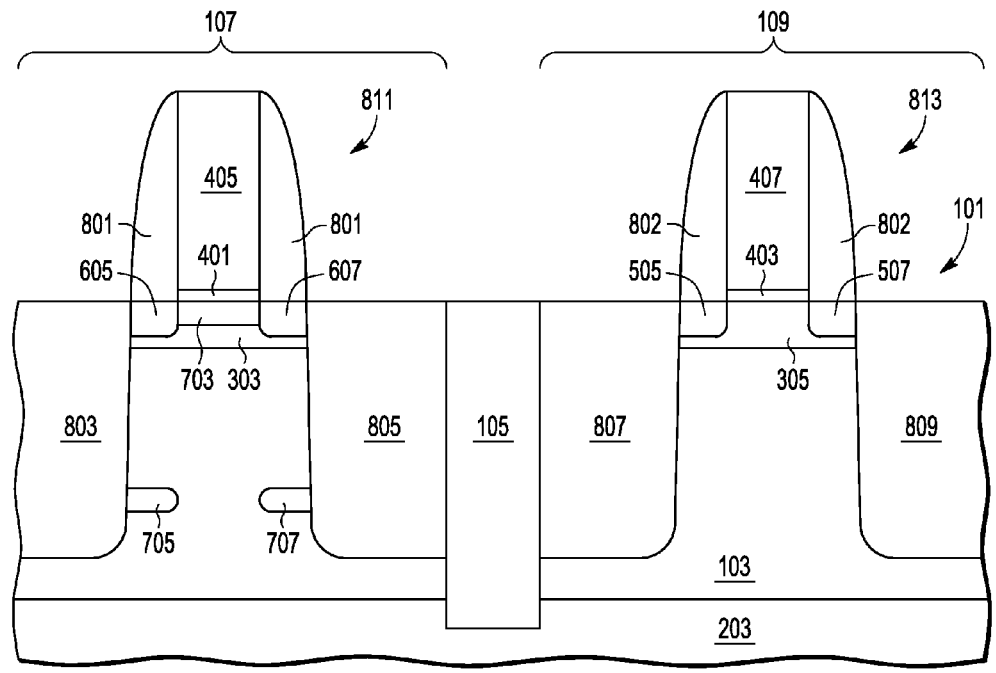

FIG. 8 shows wafer 101 after the removal of mask 601 and after the formation of deep source/drain regions 803, 805, 807, and 809. Regions 803, 805, 807, and 809 are formed by implanting conductivity dopants wherein the gates and sidewall spacers (e.g. spacers 801 and 802) of the transistors serve as an implant mask for channels and their proximity region. In an embodiment where the transistors are N-channel transistors, N type dopants are implanted in regions 803, 805, 807, and 809. In one embodiment, phosphorous is implanted into regions 803, 805, 807, and 809 at an energy in the range of 5-30 keV and at a dosage in the range of 1e12-1e13 atoms/cm2. However, other energies and dosages maybe used in other embodiments. Although FIG. 8 shows that source/drain regions are deeper than through-gate implant regions 705/707, in other embodiment source/drain regions can be shallower than or on similar depth as the through-gate implant regions 705/707.

The Figures only show two transistors 811 and 813 being formed. However multiple transistors may be formed in region 107 and in region 109. Also, although the processes described herein relate to forming N-channel transistors, those processes may be used to form P-channel transistors as well where the conductivity type of the dopants is switched (e.g. P-type dopants are used in place of the N-type dopants and vice versa). Furthermore, a wafer may have multiple regions of both P-type transistors and N-type transistors with different threshold voltages formed from the processes described herein. A P-type transistor is an opposite conductivity type of transistor from an N-type transistor.

After the stage shown in FIG. 8, wafer 101 is annealed to activate the dopants. Silicide structures (not shown) are formed on the source/drain regions and the gates. Conductive interconnect structures are formed in layers over wafer 101 and are isolated by interlayer dielectric material to couple the transistors of an integrated circuit together to form the desired circuitry. Also, external connectors (e.g. bond pads) are formed on top of the interconnect layers. The wafer is then singulated into multiple integrated circuits, each with multiple transistors. The integrated circuits may be packaged (e.g. in an encapsulating material) where they can be implemented in an electronic system. Other processes or different processes may be performed on wafer 101 in different embodiments.

In one embodiment, a method of forming a first transistor and a second transistor includes forming a first gate for the first transistor over a first region of a substrate and a second gate for the second transistor over a second region of the substrate. The method includes masking the first region with a mask after forming the first gate and the second gate and implanting conductivity dopants through the second gate into the substrate to adjust a threshold voltage of the second transistor while the first region is masked with the mask so as to inhibit the conductivity dopants from affecting the threshold voltage of the first transistor. The first transistor and the second transistor are of the same conductivity type.

In another embodiment, a method includes implanting conductivity dopants simultaneously into a first region and a second region of a substrate to a level for obtaining a first threshold voltage for transistors of a first conductivity type. The method includes forming a first gate on the first region and a second gate on the second region and implanting conductivity dopants through the second gate but not through the first gate to adjust a threshold voltage of a transistor of the second gate to a second threshold voltage. A transistor of the first gate has the first threshold voltage, wherein the transistor of the first gate and the transistor of the second gate are of the first conductivity type.

In one embodiment, a method of making a first transistor having a first threshold voltage and a second transistor having a second threshold voltage includes implanting conductivity dopants simultaneously into a first region and a second region of a semiconductor substrate. After the implanting, the method includes forming a first gate over the first region for a first transistor and a second gate over the second region for a second transistor wherein the conductivity dopants were implanted in a first channel region below the first gate and into a second channel region below the second gate. After forming the first gate and the second gate, the method includes implanting conductivity dopants in the first region for forming current electrode extensions in the first region on opposing sides of the first gate while the second region is masked. After forming the first gate and the second gate, the method includes implanting conductivity dopants in the second region for forming current electrode extensions in the second region on opposing sides of the second gate while the first region is masked with a mask. The method includes implanting conductivity dopants through the second gate into the second channel region to adjust a threshold voltage of the second transistor while the first region is masked with the mask.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a first transistor and a second transistor, comprising:
   forming a first gate for the first transistor over a first region of a substrate and a second gate for the second transistor over a second region of the substrate;
   masking the first region with a mask after forming the first gate and the second gate;
      implanting conductivity dopants through the second gate into the substrate to adjust a threshold voltage of the second transistor while the first region is masked with the mask so as to inhibit the conductivity dopants from affecting the threshold voltage of the first transistor;
   wherein the first transistor and the second transistor are of the same conductivity type;
   forming a first pair of current electrode regions on opposing sides of the first gate;
   forming a second pair of current electrode regions on opposing sides of the second gate;
   wherein forming the second pair includes implanting conductivity dopants into portions the second region of the substrate while the mask is masking the first region.

2. The method of claim 1 comprising:
   prior to forming the first gate and the second gate, implanting well region conductivity dopants simultaneously into the first region and the second region, wherein the well region conductivity dopants are implanted into a channel region of the first transistor and into a channel region of the second transistor.

3. The method of claim 2 wherein the well region conductivity dopants are implanted at a concentration and energy to set the threshold voltage of the first transistor at a desired value.

4. The method of claim 1 wherein the implanting conductivity dopants in forming the second pair includes implanting dopants of a first conductivity type, wherein the conductivity dopants implanted through the second gate are of a second conductivity type, opposite the first conductivity type.

5. The method of claim 1 wherein the implanting conductivity dopants in forming the second pair includes implanting dopants of a first conductivity type, wherein the dopants implanted through the second gate are of the first conductivity type.

6. The method of claim 1 wherein the implanting conductivity dopants into portions of the second region is characterized as implanting conductivity dopants into the substrate to form extension regions of the second pair of current electrode regions.

7. The method of claim 1 wherein the forming the first pair of current electrode regions on opposing sides of the first gate includes implanting conductivity dopants for forming deep current electrode portions of the first pair and the forming the second pair of second current electrode regions on opposing sides of the second gate includes implanting conductivity dopants for forming deep current electrode portions of the second pair, wherein the implanting conductivity dopants for forming the deep current electrode portions of the first pair and the implanting conductivity dopants for forming the deep current electrode portions of the second pair are performed simultaneously while the mask is not masking the first region.

8. The method of claim 7, further comprising after implanting conductivity dopants through the second gate, forming a first sidewall spacer around the first gate and a second sidewall spacer around the second gate prior to implanting conductivity dopants for forming the deep current electrode portions of the first pair and simultaneously implanting conductivity dopants for forming the deep current electrode portions of the second pair.

9. The method of claim 1 wherein the forming a first pair of current electrode regions on opposing sides of the first gate includes implanting conductivity dopants into a portion of the first region of the substrate while a second mask is masking the second region.

10. The method of claim 1 wherein implanting conductivity dopants through the second gate into the substrate including implanting the conductivity dopants into a channel region of the second transistor wherein the conductivity dopants are not simultaneously implanted into a channel region of the first transistor.

11. The method of claim 1 further comprising:
forming a first dielectric on the first region of the substrate, wherein the first gate is formed on the first dielectric;
forming a second dielectric on the second region of the substrate, wherein the second gate is formed on the second dielectric, wherein the second dielectric is thicker than the first dielectric.

12. The method of claim 1 comprising:
prior to forming the first gate and the second gate, implanting well region conductivity dopants simultaneously into the first region and the second region, wherein the well region conductivity dopants are implanted into a channel region of the first transistor and into a channel region of the second transistor;
wherein the well region conductivity dopants and the conductivity dopants implanted through the second gate are of the same conductivity type.

13. A method, comprising:
implanting conductivity dopants simultaneously into a first region and a second region of a substrate to a level for obtaining a first threshold voltage for transistors of a first conductivity type;
forming a first gate on the first region and a second gate on the second region;
implanting conductivity dopants through the second gate but not through the first gate to adjust a threshold voltage of a transistor of the second gate to a second threshold voltage, wherein a transistor of the first gate has the first threshold voltage, wherein the transistor of the first gate and the transistor of the second gate are of the first conductivity type
implanting conductivity dopants into the second region to form current electrode extension regions while the first region is masked with a mask, wherein implanting conductivity dopants through the second gate is performed while the first region is masked with the mask.

14. The method of claim 13 wherein the implanting conductivity dopants through the second gate increases the threshold voltage of the transistor of the second gate from the first threshold voltage to the second threshold voltage.

15. A method of making a first transistor having a first threshold voltage and a second transistor having a second threshold voltage, comprising:
implanting conductivity dopants simultaneously into a first region and a second region of a substrate;
after the implanting, forming a first gate over the first region for the first transistor and a second gate over the second region for the second transistor wherein the conductivity dopants were implanted in a first channel region below the first gate and into a second channel region below the second gate;
after forming the first gate and the second gate, implanting conductivity dopants in the first region for forming current electrode extensions in the first region on opposing sides of the first gate while the second region is masked;
after forming the first gate and the second gate, implanting conductivity dopants in the second region for forming current electrode extensions in the second region on opposing sides of the second gate while the first region is masked with a mask;
implanting conductivity dopants through the second gate into the second channel region to adjust a threshold voltage of the second transistor while the first region is masked with the mask;
after the implanting conductivity dopants through the second gate, simultaneously implanting conductivity dopants to form a first pair of deep current electrode regions for the first transistor and implanting conductivity dopants to form a second pair of deep current electrode regions for the second transistor.

16. The method of claim 15 wherein the conductivity dopants implanted for forming the current electrode extensions in the first region and the conductivity dopant implanted for forming the current electrode extensions in the second region are of an opposite conductivity type to the conductivity dopants implanted through the second gate.

17. The method of claim 15 wherein:
implanting conductivity dopants simultaneously includes implanting conductivity dopants of a first conductivity type;
implanting conductivity dopants in the first region for forming current electrode extensions includes implanting conductivity dopants of a second conductivity type opposite the first conductivity type;
implanting conductivity dopants in the second region for forming current electrode extensions includes implanting conductivity dopants of the second conductivity type;

implanting conductivity dopants through the second gate into the second channel region includes implanting conductivity dopants of the first conductivity type.

* * * * *